United States Patent
Xue et al.

(10) Patent No.: US 10,468,592 B1
(45) Date of Patent: Nov. 5, 2019

(54) MAGNETIC TUNNEL JUNCTIONS AND METHODS OF FABRICATION THEREOF

(71) Applicant: Applied Materials, Inc., Santa Clara, CA (US)

(72) Inventors: Lin Xue, San Jose, CA (US); Chi Hong Ching, Santa Clara, CA (US); Xiaodong Wang, San Jose, CA (US); Rongjun Wang, Dublin, CA (US); Mahendra Pakala, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/029,844

(22) Filed: Jul. 9, 2018

(51) Int. Cl.
| | |
|---|---|
| H01L 43/12 | (2006.01) |
| H01F 10/32 | (2006.01) |
| H01F 41/32 | (2006.01) |
| H01L 43/10 | (2006.01) |
| H01L 43/02 | (2006.01) |
| G11C 11/16 | (2006.01) |

(52) U.S. Cl.
CPC ............ *H01L 43/12* (2013.01); *G11C 11/161* (2013.01); *H01F 10/3254* (2013.01); *H01F 10/3272* (2013.01); *H01F 10/3286* (2013.01); *H01F 41/32* (2013.01); *H01L 43/02* (2013.01); *H01L 43/10* (2013.01); *H01F 10/329* (2013.01)

(58) Field of Classification Search
CPC ......... H01L 43/12; H01L 43/02; H01L 43/10; G11C 11/161; H01F 10/3286; H01F 10/3272; H01F 41/32; H01F 10/3254; H01F 10/329
See application file for complete search history.

(56) References Cited

U.S. PATENT DOCUMENTS

| | | | |
|---|---|---|---|
| 6,958,927 B1 * | 10/2005 | Nguyen | G11C 11/16 |
| | | | 257/295 |
| 7,598,579 B2 | 10/2009 | Horng et al. | |
| 2007/0258170 A1 * | 11/2007 | Yuasa | H01L 43/08 |
| | | | 360/324.2 |

(Continued)

FOREIGN PATENT DOCUMENTS

| | | |
|---|---|---|
| KR | 101537715 B1 | 7/2015 |
| KR | 20160010139 A | 1/2016 |
| WO | 20170134697 A1 | 8/2017 |

OTHER PUBLICATIONS

International Search Report and Written Opinion for PCT/US2019/035457, dated Sep. 27, 2019.

*Primary Examiner* — Karen Kusumakar
(74) *Attorney, Agent, or Firm* — Patterson + Sheridan LLP (57) ABSTRACT

Embodiments of the present disclosure are for systems and methods for fabrication of a magnetic tunnel junction stack. This fabrication can occur via methods including one or more of (1) heating the substrate after the deposition of a buffer layer on the substrate, prior to deposition of a seed layer; (2) cooling the substrate after the deposition of a second pinning layer, before deposition of a structure blocking layer; (3) heating the substrate during the deposition of a tunnel barrier layer and then cooling it after the deposition of the tunnel barrier layer is complete; (4) heating the substrate after the deposition of a magnetic storage layer on the tunnel barrier layer; and (5) cooling the substrate after the deposition of the magnetic storage layer before a first interlayer of the capping layer is deposited.

24 Claims, 6 Drawing Sheets

(56) References Cited

U.S. PATENT DOCUMENTS

| | | | |
|---|---|---|---|
| 2013/0064971 A1* | 3/2013 | Carey | G11B 5/3906 427/123 |
| 2013/0216702 A1 | 8/2013 | Kaiser et al. | |
| 2014/0248719 A1 | 9/2014 | Zhou et al. | |
| 2015/0008550 A1* | 1/2015 | Min | H01F 10/32 257/421 |
| 2015/0255507 A1 | 9/2015 | Pakala et al. | |
| 2016/0351799 A1 | 12/2016 | Xue et al. | |
| 2017/0018706 A1 | 1/2017 | Xue et al. | |

* cited by examiner

MAGNETIC TUNNEL JUNCTIONS AND METHODS OF FABRICATION THEREOF

BACKGROUND

Field

Embodiments of the present disclosure generally relate to fabricating magnetic tunnel junction structures for magnetic random access memory (MRAM) applications.

Description of the Related Art

Spin transfer torque magnetic random access memories, or STT-MRAMs, employ magnetic tunnel junction structures in the memory cells thereof, wherein two ferro-magnetic layers are spaced from one another by a thin insulating or "dielectric" layer. One of the magnetic layers has a fixed magnetic polarity, the other, that may be referred to as the free layer, has a magnetic polarity which is selectively changeable between two states. Where the magnetic layers have perpendicular magnetic anisotropy, the polarity of the changeable polarity layer can be switched between having the same polarity as the fixed polarity layer, or the opposite polarity to that of the fixed polarity layer, in the depth direction of a stack of film layers comprising the magnetic tunnel junction or "MTJ" structure. The electric resistance across the MTJ is a function of the polarity of the changeable polarity layer with respect to the fixed polarity layer. Where the polarities of the two layers are the same in the depth direction of the MTJ, the electric resistance across the MTJ is low, and when they are opposite to one another in the depth direction of the MTJ, the electric resistance across the MTJ is high. Thus, the electrical resistance across the cell can be used to indicate a value of 0 or 1, and thus store a data value, for example by using the low resistance state as having the data value of 0, and the high resistance state as the data value of 1.

To form an MTJ stack, a film layer stack is fabricated that includes a first pinning layer and a second pinning layer and a synthetic anti-ferrimagnetic (SyF) coupling layer in between the first pinning layer and the second pinning layer. The moments of the first pinning layer and the second pinning layer is coupled through the SyF coupling layer by interlayer exchange coupling effect. The SyF coupling layer with a thickness maintains an anti-parallel alignment of the magnetic moments of the first and second pinning layers. The first pinning layer typically has larger magnetic moment as it is farther away from the free layer, which would help minimize the dipole field to the free layer from the rest of the stack.

Where MTJs employ synthetic anti-ferrimagnetic (SyF) layers that comprise two or more ferromagnetic layers separated by a nonmagnetic layer, SyF coupling can be lost after high temperature processing thereof, for example processing at temperatures at or above about 400° C.

Thus, there remains a need for an improved MTJ stack that can withstand processing temperatures.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

SUMMARY

In an embodiment, a method of fabricating a device comprising: forming a magnetic tunnel junction stack, wherein forming the magnetic tunnel junction stack comprises: depositing, via physical vapor deposition (PVD), a buffer layer on a substrate, wherein the substrate is at a buffer deposition temperature; depositing, via PVD, a seed layer on the buffer layer, the substrate being at a seed layer deposition temperature from 200° C. to 600° C. during deposition of the seed layer; depositing, via PVD, a first pinning layer on the buffer layer, the substrate being at a first pinning layer deposition temperature during deposition of the first pinning layer; depositing, via PVD, a synthetic anti-ferrimagnetic (SyF) coupling layer on the first pinning layer, wherein the substrate is at a SyF coupling layer temperature during deposition of the SyF coupling layer; depositing, via PVD, a second pinning layer on the SyF coupling layer, while the substrate is at a second pinning layer deposition temperature; lowering the substrate temperature from the second pinning layer deposition temperature to a structure blocking layer deposition temperature from about −270° C. to about 100° C.; and depositing, via PVD, a structure blocking layer on the second pinning layer while the substrate is at the structure blocking layer deposition temperature.

In an embodiment, a computer-readable medium including instructions that are configured to cause a computing system to: deposit a seed layer on a buffer layer, wherein the substrate is at a seed layer deposition temperature from 200° C. to 600° C. during deposition of the seed layer; deposit a first pinning layer on the buffer layer while the substrate is at a first pinning layer deposition temperature; deposit a synthetic anti-ferrimagnetic (SyF) coupling layer on the first pinning layer while the substrate is at a SyF coupling layer deposition temperature; deposit a second pinning layer on the SyF coupling layer; lower the substrate temperature from the second pinning layer deposition temperature to a structure blocking layer deposition temperature from about −270° C. to about 100° C.; and subsequently, deposit a structure blocking layer on the second pinning layer while the substrate is at the structure blocking layer deposition temperature.

In an embodiment, a method of fabricating a magnetic tunnel junction, comprising: depositing, via physical vapor deposition (PVD), a second pinning layer on a SyF coupling layer on a substrate, wherein, subsequent to depositing the second pinning layer, the substrate is at a second pinning layer deposition temperature from about −270° C. to about 100° C.; depositing, via PVD, a structure blocking layer on the second pinning layer while the substrate is at a structure blocking layer deposition temperature from about −270° C. to about 100° C.; and depositing, via PVD, a magnetic reference layer on the structure blocking layer while the substrate is at a magnetic reference layer deposition temperature during deposition of the magnetic reference layer, wherein the magnetic reference layer deposition temperature is from about −270° C. to about 100° C. In this embodiment, the method further comprises depositing, via PVD, a tunnel barrier layer on the magnetic reference layer by: depositing a first portion of the tunnel barrier layer while the substrate is at a first tunnel barrier deposition temperature; raising the substrate temperature to a second tunnel barrier layer deposition temperature from about 300° C. to about 600° C.; and depositing the second portion of the tunnel barrier layer, wherein the first portion is from 10% to 90% of a total thickness of the tunnel barrier layer.

DETAILED DESCRIPTION

Embodiments of the present disclosure relate to magnetic tunnel junction (MTJ) stacks and STT MRAM memory cells and memories. Herein, the MTJ stacks are incorporated in a film stack including upper and lower electrodes, wherein the MTJ stack is sandwiched therebetween the upper electrodes and the lower electrodes. The MTJ stack can be patterned to form a plurality of individual memory cells used in a magneto-resistive random-access memory (MRAM). In each MTJ stack of an MRAM cell there are two magnetic layers, wherein one magnetic layer has a fixed polarity and the other has a polarity that can be switched by imposing a voltage across the layer or by applying a current to that magnetic layer. The electrical resistance across the MRAM changes based on the relative polarity between the first and second magnetic layers. The first and second magnetic layers are referred to herein as a magnetic reference layer and a magnetic storage layer. The memory cells formed from the MTJ stacks operate when there is a voltage imposed across the cell or when there is a current passed through the cell. In response to the application of voltage of sufficient strength, the polarity of the switchable magnetic layer can be changed. Additionally, the resistivity of the cell can be determined by measuring the current vs. voltage relationship across the cell at a relatively low voltage below the threshold required to switch the magnetic polarity of the magnetic storage layer.

The MTJ stack discussed herein is formed using a plurality of chambers including deposition chambers to deposit thin film layers on a substrate, and, ultimately, to pattern and etch those deposited film layers. The deposition chambers used to form the MTJ stack discussed herein include physical vapor deposition (PVD) chambers. In conventional MTJ stack fabrication, a temperature of the substrate is from about room temperature (20° C. –25° C.) to less than about 350° C. and may not be varied among and between the deposition of the layers of the MTJ stack. In contrast, using the systems and methods discussed herein, the MTJ is fabricated in a series of deposition operations where a temperature of the substrate is raised, lowered, or held among and between depositions of various layers of the MTJ stack. The variation in temperature during the MTJ stack fabrication improves and promotes the formation of desired lattice (crystalline) structures of each layer, and improves lattice matching between layers. The MTJ stacks fabricated according to embodiments of the present disclosure are processed after fabrication, including an annealing operation at about 400° C. for about 3 hours, and exhibit both robust magnetic and electrical properties as well as a decreased roughness in between layers subsequent to annealing.

The deposition temperatures discussed herein that are used during formation of the MTJ stack can be achieved by heating or cooling the substrate support, or by use of a radiant heat lamp, or by heating the substrate via a laser such as a 532 nm laser or an 810 nm laser. Temperature control of the substrate can result in improved control of lattice structures and thus improved lattice matching between layers, which creates a more robust MTJ stack that can withstand subsequent high-temperature processes on the order of 400° C. Heating the substrate before, during, or after deposition promotes growth of the deposited material layer along the lattice texture of the underlying layer. Holding a temperature in between layer depositions can also promote formation of a lattice structure of a top layer that is the same as the lattice structure of the underlying layer. Conversely, cooling the substrate before, during, or after layer deposition blocks the deposited layer from forming the lattice structure of the underlying layer and preserves the lattice structure of the deposited layer.

In an embodiment, the MTJ stack substrate can be one or more of (1) heated after the deposition of a buffer layer on the substrate, prior to deposition of a seed layer; (2) cooled after the deposition of a second pinning layer, before deposition of a structure blocking layer; (3) heated during the deposition of a tunnel barrier layer and then cooled after the deposition of the tunnel barrier layer is complete; (4) heated after the deposition of a magnetic storage layer on the tunnel barrier layer; and (5) cooled after the deposition of the magnetic storage layer before a first interlayer of the capping layer is deposited, depending upon an intended lattice structure of the first interlayer.

In one example, when a first layer has a face-centered-cubic (fcc) crystalline structure and a second layer is to be deposited over the first layer to have an fcc structure, the substrate can be heated during or after deposition of the first layer (or a first interlayer of a layer), and the raised temperature can be maintained during the deposition of the second layer (or the second interlayer of the layer) so that the second layer forms an fcc structure. Conversely, if a first layer has an fcc crystalline structure, and a second layer is to be deposited over the first layer to have a body-centered-cubic (bcc) structure, the substrate can be cooled during or after deposition of the first layer. The lowered temperature can be maintained during deposition of the second layer so that the second layer forms a bcc structure and does not adopt the fcc structure of the underlying layer.

In the PVD operations described herein that are used to form an MTJ stack, a plasma is formed of an inert or noble gas such as argon (Ar), helium, (He), krypton (Kr), and/or xenon (Xe) in the sputtering chamber while the chamber is maintained in a vacuum state. The PVD chambers used herein further contain at least one sputtering target, and a substrate is disposed therein facing a generally flat surface of the sputtering target. The sputtering target is coupled to a power supply such that the sputtering target is electrically driven to, or self establishes, a cathodic state in a circuit of the power supply, through the plasma, to ground, for example a grounded portion of the sputtering chamber. The substrate is disposed on a pedestal or on another structure in the sputtering chamber, the pedestal or other structure may be at a floating potential, connected to ground, or may be biased to form an anode in the cathodic target to direct plasma to the anode or to the ground circuit. The positively ionized portion of the inert gas atoms in the sputtering chamber are electrically attracted to the negatively biased target, and, thus, ions of the plasma bombard the target, which causes atoms of the target material to be ejected and deposit on the substrate to a form a thin film composed of the target material(s) on the substrate.

Figure 1A:
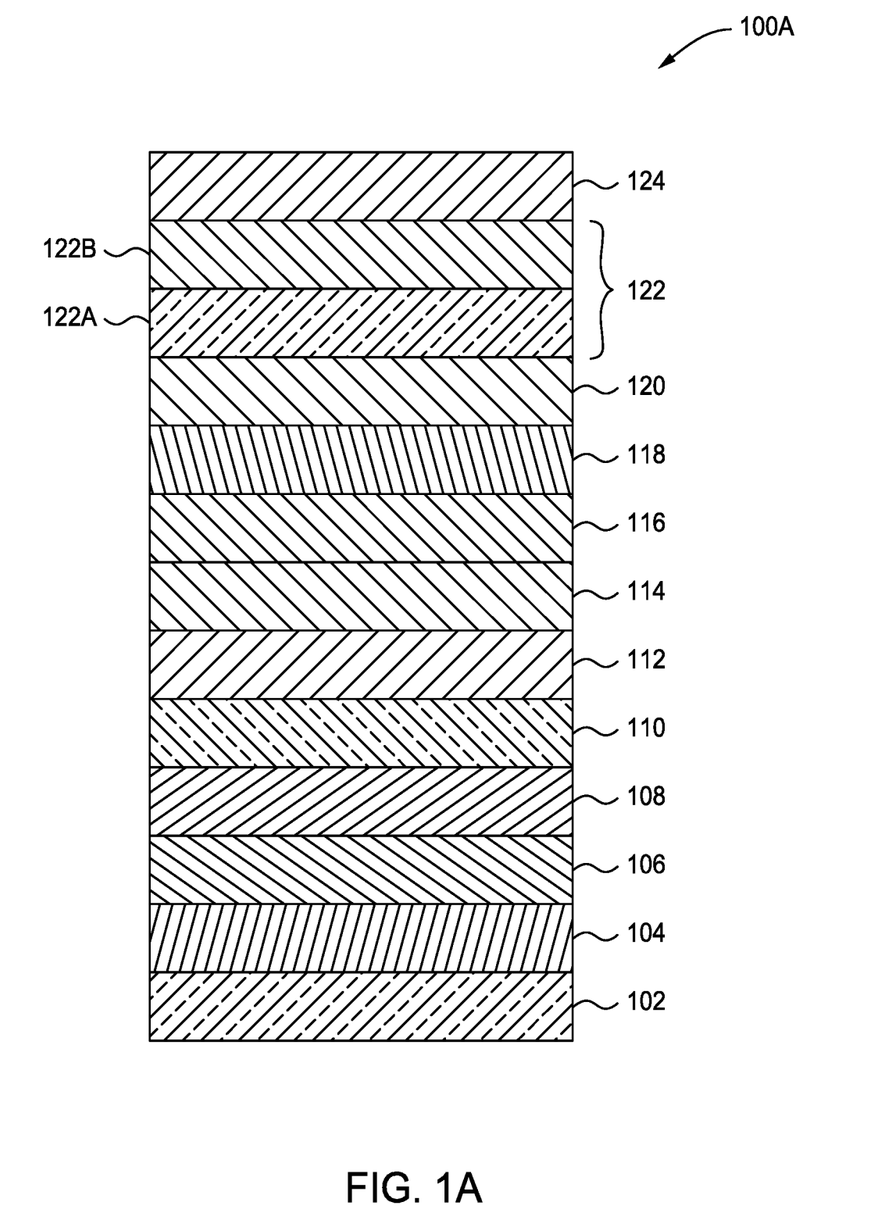
FIG. 1A is a schematic illustration of an example magnetic tunnel junction (MTJ) stack fabricated according to embodiments of the present disclosure.

FIG. 1A is a schematic illustration of a magnetic tunnel junction (MTJ) stack. FIG. 1A shows an MTJ stack 100A that includes a substrate 102 comprising a conductive layer of tungsten (W), tantalum nitride (TaN), titanium nitride (Tin), or other metal layers thereof. In some examples, the substrate 102 includes one or more transistors, bit or source lines, and other memory lines, previously fabricated therein or thereon, or other elements to be used to form an MRAM memory and previously fabricated or formed thereon. The substrates on which the MTJ stacks are formed can have dimensions including a diameter of less than 200 mm, a diameter of 200 mm, a diameter of about 300 mm, about 450 mm, or another diameter, and may have a shape of a circle or a rectangular or square panel. A buffer layer 104 in the MTJ stack 100A is formed on the substrate 102 by sputtering one or more targets in a PVD chamber having the substrate therein, and here comprises one or more layers of $Co_xFe_yB_z$, TaN, Ta, or combinations thereof. A seed layer 106 is deposited via sputtering in a PVD chamber over the buffer layer 104 and is used to improve adhesion and seeding of subsequently deposited layers in the MTJ stack 100A by reducing or eliminating lattice mismatch between the buffer layer 104 and the seed layer 106. In an embodiment, the seed layer 106 comprises an fcc lattice structure. The buffer layer 104 is used in the MTJ stack 100A to improve adhesion of the seed layer 106 to the substrate. The seed layer 106 here comprises platinum (Pt), chromium (Cr), or ruthenium (Ru) and is formed by sputtering a target of Pt, Cr, or Ru, or an alloy thereof, in a PVD chamber having the substrate therein.

A first pinning layer 108 is formed on the seed layer 106 by sputtering and has an fcc lattice structure. The first pinning layer 108 comprises a Co layer and/or one or more bilayers. Each bilayer comprises a first interlayer of Co and a second interlayer of nickel (Ni) or platinum (Pt). A synthetic anti-ferrimagnetic (SyF) coupling layer 110 is formed here over the first pinning layer 108 by sputtering and has an fcc lattice structure as-formed. The SyF coupling layer 110 can be formed of ruthenium (Ru), rhodium (Rh), Cr, or iridium (Ir) sputtered from a target thereof. A second pinning layer 112 is formed over the SyF coupling layer 110 by sputtering. The second pinning layer 112 as-formed has an fcc lattice structure and can comprise a single cobalt (Co) layer and/or a bilayer comprising a first interlayer of Co and a second interlayer of nickel (Ni) or platinum (Pt). The SyF coupling layer 110 is located between the first pinning layer 108 and the second pinning layer 112 and causes surface atoms of the first pinning layer 108 and the second pinning layer 112, when exposed to a magnetic field, to align with surface atoms of the SyF coupling layer 110, thereby pinning the orientation of the magnetic moment of each of the first pinning layer 108 and the second pinning layer 112. The first pinning layer 108 and the second pinning layer 112 each comprise similar magnetic moments, and will thus react similarly when an external magnetic field is applied to the MTJ stack 100A. The SyF coupling layer 110 maintains an anti-parallel alignment of the magnetic moments of the first 108 and second 112 pinning layers.

A structure blocking layer 114 is formed over the second pinning layer 112, and here comprises tantalum (Ta), molybdenum (Mo), tungsten (W), or combinations thereof. The structure blocking layer 114 has a bcc lattice structure as-formed and is employed because of its lattice structure, which differs from the lattice structure of the first 108 and second 112 pinning layers. The structure blocking layer 114 prevents against formation of a short circuit between the MTJ stack 100A and metallic contacts that can be coupled to the MTJ stack 100A to form MRAM memory cells. Further in the MTJ stack 100A, a magnetic reference layer 116 is formed over the structure blocking layer 114 by sputtering in a PVD chamber. A tunnel barrier layer 118 is formed over the magnetic reference layer 116, and a magnetic storage layer 120 is formed over the tunnel barrier layer 118. The magnetic reference layer 116, the tunnel barrier layer 118, and the magnetic storage layer 120 each has a bcc lattice structure. Each of the tunnel barrier layer 118, the magnetic reference layer 116, and the magnetic storage layer 120 are formed by sputtering one or more targets using plasma in one or more PVD chambers. The magnetic reference layer 116 and the magnetic storage layer 120 each comprise a $Co_xFe_yB_z$ alloy which may vary in composition. Additionally, the magnetic storage layer 120 can comprise one or more layers of Ta, Mo, W, or Hf, or combinations thereof. The tunnel barrier layer 118 comprises an insulating material, and can be fabricated from a dielectric material such as MgO. A composition and a thickness of the tunnel barrier layer 118 are each selected so as to create a large tunnel magnetoresistance ratio (TMR) in the tunnel barrier layer 118 of the MTJ stack 100A. The TMR is a measurement of a change in resistance in the MTJ stack 100A from the anti-parallel state ($R_{ap}$) to the parallel state ($R_p$) and can be expressed as a percentage using the formula (($R_{ap}-R_p$)/$R_p$). When a bias is applied to the MTJ stack 100A, the tunnel barrier layer 118 is traversed by spin-polarized electrons, and this transmission of electrons through the tunnel barrier layer 118 results in electrical conduction between the magnetic reference layer 116 and the magnetic storage layer 120.

A capping layer 122 is formed by sputtering in a PVD chamber on the magnetic storage layer 120 and comprises a plurality of interlayers in this embodiment. The capping layer 122 includes a first capping interlayer 122A and a second capping interlayer 122B. The first capping interlayer 122A can be fabricated from a dielectric material such as MgO and/or an iron oxide and can further comprise capping interlayer 122A Ru and/or Ir. The second capping interlayer 122B comprises a metallic material such as Ru, Ir, Ta, or combinations thereof, and is formed over the first capping interlayer 122A. The first capping interlayer 122A acts as an etch stop layer for hard mask etching and protects the MTJ stack 100A from corrosion. The second capping interlayer 122B is configured to electrically communicate with transistors or contacts when the MTJ stack 100A is later patterned, as discussed below with respect to FIG. 1B. The lattice structures of the first capping interlayer 122A and the second capping interlayer 122B can vary depending upon the composition of each interlayer. A hardmask layer 124 over the second capping interlayer 122B to protect the MTJ stack 100A can be patterned during subsequent operations. The hardmask layer 124 can be formed by various processes depending upon its composition.

A PVD system can include one or more PVD sputtering chambers such as the example chamber shown below in FIG. 3. The one or more PVD sputtering chambers are coupled to a central robotic substrate transfer chamber. The central robotic substrate transfer chamber is configured to move substrates between loading stations coupled thereto and the sputtering chambers connected thereto. The PVD system is kept at a base vacuum pressure of, for example, 10 E$^{-9}$ Torr, so that the substrate on which the MTJ stack is being formed is not exposed to an external atmosphere when the substrate is moved among and between PVD chambers during fabrication of the MTJ film layer stack thereon. The temperature variation during MTJ stack fabrication forms layers of desired lattice structures, e.g., face-centered-cubic, body-centered cubic, etc. The temperature control during MTJ stack formation results in improved lattice matching among and between layers, which results in a more robust MTJ stack that maintains its magnetic and electrical properties subsequent to annealing at temperatures on the order of about 400° C.

Figure 1B:
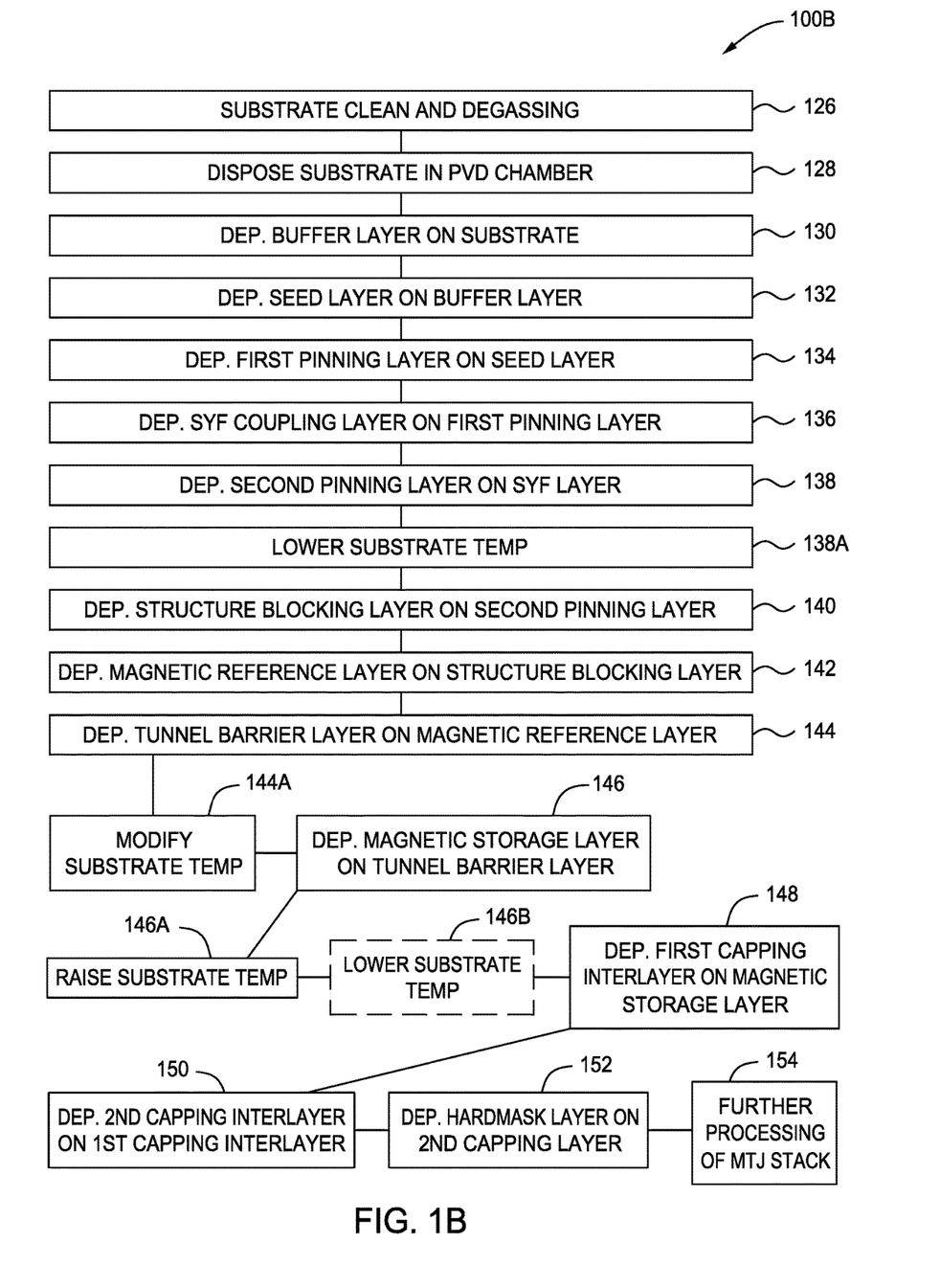
FIG. 1B is a flow diagram of a method of fabricating memory devices including magnetic tunnel junction (MTJ) stacks according to embodiments of the present disclosure.

FIG. 1B is a flow diagram of a method 100B of fabricating memory devices that include an MTJ stack 100A. The method 100B is executed in part in a plurality of PVD chambers of a PVD system that are configured to deposit thin film layers by sputtering. The substrate 102 can be moved among and between sputtering chambers via the central robotic transfer chamber of the PVD system to form various thin film layers, including the MTJ stack 100A in FIG. 1A and the MTJ stacks shown and discussed below that are fabricated according to embodiments of the present disclosure. In contrast to conventional MTJ stack fabrication methods, the operations of the method 100B can occur at temperatures from about 20° C. to temperatures on the order of about 600° C., and the substrate temperature can be adjusted via heaters in the substrate support pedestal, a radiant heat lamp, and/or a laser annealing apparatus during, before, and/or after the operations discussed herein. The adjustment of the temperature during the method 100B promotes lattice structure formation and lattice matching between layers of the MTJ stack 100A, creating a more robust MTJ stack that can withstand processing operations on the order of 400° C. An example PVD chamber capable of operating in the manner(s) discussed herein is shown below at FIG. 3.

The layers of FIG. 1A are thus referenced herein with respect to the method 100B. The operations of the method 100B are performed using one or more gases including argon (Ar), helium (He), krypton (Kr), xenon (Xe), oxygen (O$_2$), or nitrogen (N$_2$) as a plasma species in the PVD chamber or chambers. The processing pressure in the PVD chambers during the method 100B can be from about 2 mTorr to about 3 mTorr. The substrate 102 can be moved among and between PVD chambers depending upon the composition of the sputtering target(s) used for each layer of the MTJ stack 100A. In the method 100B, at operation 126, a substrate undergoes operations including degassing and pre-cleaning in Ar gas plasma or in He/H plasma. The substrate 102 discussed at operation 126 can comprise a plurality of layers including an MTJ contact (not shown separately from the substrate 102) formed during previous operations. During the method 100B, the substrate can be moved between process chambers through or via a central robotic substrate transfer chamber. At operation 128, the substrate 102 is transferred from the central robotic substrate transfer chamber to a PVD chamber of a plurality of PVD chambers. Subsequently, at operation 130, the buffer layer 104 is deposited on the substrate 102 by sputtering in the target of the PVD chamber. A power from 1 kW to 100 kW is applied to the one or more PVD chambers discussed herein to ionize a portion of the Ar and form the plasma used in operation 130. The ejected surface atoms of the target are deposited on the substrate 102 to form the buffer layer 104. During formation of the buffer layer 104 at operation 130, a sputtering target or targets comprising Co$_x$Fe$_y$B$_z$, TaN, and/or Ta are sputtered in the PVD chamber using Ar plasma to form the buffer layer 104. In an embodiment where the buffer layer 104 is or includes Ta, the buffer layer 104 is sputtered in a PVD chamber using a Ta target and Ar plasma.

In an embodiment, operation 130 can be performed when the substrate 102 is at room temperature (from about 20° C. to about 25° C.). In one example, the substrate temperature is controlled via a plurality of heaters in the substrate support pedestal, and, in other examples, radiant heat lamps or a laser annealing operation can be performed on the substrate to control the temperature. In an example where the buffer layer 104 is or includes TaN, operation 130 is performed when nitrogen gas (N$_2$) is present in the PVD chamber and Ar plasma is used to sputter a Ta sputtering target to form the buffer layer 104 to comprise TaN. In another example where the buffer layer 104 is or includes TaN, operation 130 is performed in a PVD chamber using a TaN sputtering target and Ar plasma to form the buffer layer 104. During formation of the buffer layer 104 and subsequent layers, the one or more PVD chambers used are maintained at vacuum pressure while the temperature is varied as discussed below. Subsequently, in operation 132, the seed layer 106 is deposited on the buffer layer 104 by sputtering a target in a PVD chamber. The seed layer 106 has an fcc lattice structure as-deposited at operation 132. During operation 132, a temperature of the substrate 102 during deposition of the seed layer 106 is from about 200° C. to about 600° C., and, in some embodiments, from about 350° C. to about 500° C.

The first pinning layer 108 is deposited on the seed layer 106 at operation 134 by sputtering a target in a PVD chamber. The first pinning layer 108 is shown in the MTJ stack 100A, and can be deposited at operation 134 in a PVD chamber by sputtering one or more targets using Ar plasma. A temperature of the substrate 102 during deposition of the first pinning layer 108 at operation 134 is from about 200° C. to about 600° C., and is at or below the substrate temperature during operation 132. The substrate temperature during operation 134 promotes formation of the fcc lattice structure of the first pinning layer 108, which is the same lattice structure as the underlying seed layer 106. In an example where the first pinning layer 108 is Co layer, a Co target sputtered using Ar plasma in the PVD chamber. In an example where the first pinning layer 108 comprises one or more bilayers, operation 134 uses a Co sputtering target to form the first interlayer of the bilayer and uses another sputtering target composed of a different element to form the second interlayer of the bilayer. Depending upon the embodiment, the Co sputtering target and the sputtering target of the other element, such as nickel or platinum, can be sputtered using Ar plasma in the same PVD chamber using multiple targets; or, each layer of the bilayer can be formed in separate PVD chambers.

In an embodiment, to deposit the first pinning layer 108, xenon (Xe) or argon (Ar) gas is introduced in the PVD chamber at a flow rate of about 2 sccm-40 sccm while a power from 50 W to 10000 W is applied to the target at a negative voltage to form a plasma. In another example, the Xe or Ar gas is introduced to the PVD chamber at a flow rate from 5 sccm to 20 sccm, and, in some examples, at a flow rate of 10 sccm. In another example, the power applied to the one or more sputtering targets used to form the first pinning layer 108 is from 100 W to 800 W. In another example, the power applied to the one or more sputtering targets can be 400 W. Depending upon a composition of the first pinning layer 108, Xe gas can be used in the sputtering operation in the PVD chamber at operation 134 to form the plasma since it is a heavier gas than Ar, and therefore yields ions with higher atomic weights than the ions formed using Ar or other, lighter, gases. Thus, the Xe plasma bombards the target with more energy than the Ar plasma and can be used to sputter deposit layers such as Pt. In one example of the first pinning layer 108 in the present disclosure, Xe, Ar or a mixture thereof is introduced into the PVD chamber at a flow rate from about 10 sccm and a power of 400 W is applied to the target at a negative voltage to form Ar or Xe plasma.

The bilayer of the first pinning layer 108 can be deposited at operation 134 in a PVD chamber which comprises a plurality of targets including the Co target and a target formed from Pt or Ni, or combinations or alloys thereof, or in separate PVD chambers, with one PVD chamber containing a Co target and the other PVD chamber containing a target of Pt or Ni, or combinations or alloys thereof. In one example, the plurality of sputtering targets is disposed in a single PVD chamber and sputtered using Ar plasma and/or Xe plasma. Each of the Co target and the target of the other element can be selectively exposed to the plasma using the shield discussed herein to form the Co interlayer of the bilayer and to form an interlayer of the other element to form a resultant bilayer. The interlayer depositions can be repeated at operation 134 for a plurality of iterations to form a plurality of bilayers of the first pinning layer 108 as shown in FIG. 2B.

The SyF coupling layer 110 is deposited on the first pinning layer 108 at operation 136 by sputtering a target of Ru, Cr, Rh, or Ir in a PVD chamber using Ar, Kr, or Xe plasma. In one example the SyF coupling layer 110 is deposited in a PVD chamber at operation 136 using a sputtering target of Ru, Cr, Rh, or Ir. In an embodiment, a temperature of the substrate 102 during operation 136 is at or below the substrate temperature at operation 134, which, as noted above, is from about 200° C. to about 600° C. The substrate temperature at operation 136 promotes formation of an fcc lattice structure of the SyF coupling layer 110, which matches the fcc lattice structure of the underlying first pinning layer 108. In one example of forming the SyF coupling layer 110 at operation 136, an Ir sputtering target is sputtered in the PVD chamber using Kr or Xe as the plasma gas. The Xe gas or Kr gas, from which the plasma is formed, is introduced into the PVD chamber at a flow rate from 10 sccm to 25 sccm, and in some examples, at a gas flow rate of 16 sccm. In another example of forming the SyF coupling layer 110 at operation 136, a Ru sputtering target is sputtered in the PVD chamber using Ar plasma. The Ar gas from which the plasma is formed to sputter the Ru target is introduced to the PVD chamber at a gas flow rate from 2 sccm to 10 sccm, and, in some examples, the gas flow rate of Ar is 6 sccm. Further in the example at operation 136, when Kr, Xe, or Ar gas is used in the PVD chamber, a power from between 150 W and 300 W is applied to the target at a negative voltage to form and maintain the Kr, Xe, or Ar plasma, and, in some embodiments a power of about 250 W is used.

The second pinning layer 112 is deposited on the SyF coupling layer 110 in a PVD chamber at operation 138. During operation 138, a temperature of the substrate 102 is about the same as the temperature of the substrate 102 during operation 136 (from about 200° C. to about 600° C.). The second pinning layer 112 as-formed has an fcc lattice structure, which matches the fcc lattice structure of the underlying SyF coupling layer 110. The formation of the fcc lattice structure of the second pinning layer 112 is promoted by the temperature during operation 138. In one example, the second pinning layer 112 is formed of Co using a Co target and Ar plasma in the PVD chamber. In another example, the second pinning layer 112 includes a bilayer, and may or may not include a Co layer formed in contact with the bilayer.

In an example where at least one bilayer is formed as a part of the second pinning layer 112, the bilayer is formed in a PVD chamber in a similar manner as the bilayer formed as a part of the first pinning layer 108 and discussed above. In an embodiment, the second pinning layer 112 further comprises a Co layer formed over the at least one bilayer to a thickness of up to 10 Å. In an embodiment, the second pinning layer 112 can have a total thickness from 0.3 nm to 15 nm. In an embodiment where Xe gas is used to form plasma in the PVD chamber, the Xe gas is introduced into the PVD chamber at a flow rate from about 2 sccm to about 40 sccm, or from 5 sccm to 20 sccm, and, in some embodiments, the Xe gas is introduced into the PVD chamber at a flow rate of about 10 sccm. During the formation of the second pinning layer 112, a power from 50 W to about 1000 W is applied to the target at a negative voltage to form and maintain the Ar and/or Xe plasma. In some examples, a power from 100 W to 600 W is applied to the target at a negative voltage to form and maintain the Ar and/or Xe plasma, and, in some embodiments a power of about 200 W is applied to the target at a negative voltage. In an embodiment, at operation 138A, subsequent to deposition of the second pinning layer 112 at operation 138, the temperature of the substrate 102 is lowered to a temperature from about −270° C. to about 100° C., or from about −200° C. to about 25° C. The temperature of the substrate 102 is lowered at operation 138A to cool the second pinning layer 112, which has an fcc lattice structure, so that subsequently deposited layers form other lattice structures such as bcc lattice structures, as discussed below.

The structure blocking layer 114 is deposited at operation 140 to comprise a bcc lattice structure. The formation of the bcc lattice structure of the structure blocking layer 114 at operation 140 is promoted by lowering the substrate temperature at operation 138A prior to deposition of the structure blocking layer 114 at operation 140. In an embodiment, the structure blocking layer 114 is formed in a PVD chamber that comprises sputtering targets including Ta, Mo, and/or W, depending upon an intended composition of the structure blocking layer 114. During operation 140, a temperature of the substrate 102 can be within the range established at operation 138A, e.g., from about −270° C. to about 100° C. The substrate temperature can be held at a constant temperature during operation 140, or can be ramped up from the temperature at operation 138 to a different temperature within the range of −270° C. to about 100° C. The deposition temperature at operation 140 promotes the formation of the structure blocking layer 114 as a bcc lattice structure, in contrast to higher deposition temperatures that may cause the structure blocking layer 114 to undesirably form other lattice structures, such as the fcc lattice structure of the underlying second pinning layer 112.

The magnetic reference layer 116 is subsequently deposited on the structure blocking layer 114 at operation 142. The magnetic reference layer 116 can be formed in a PVD chamber using a sputtering target that is a $Co_xFe_yB_z$ alloy, or by using individual sputtering targets of Co, Fe, or B, or by a combination of an alloy sputtering target(s) and a single-element sputtering target(s), e.g., a CoFe target and a B target. During operation 142, a temperature of the substrate is from about −270° C. to about 100° C., and is at or above the substrate temperature at operation 140. The magnetic reference layer 116 as-formed has a bcc lattice structure, which matches the bcc lattice structure of the underlying structure blocking layer 114.

The tunnel barrier layer 118 is deposited on the magnetic reference layer 116 at operation 144. The tunnel barrier layer 118 is deposited at operation 144 to have a bcc lattice structure. A temperature of the substrate 102 during operation 144 varies as discussed below. In one example, a first portion of the tunnel barrier layer 118 is deposited during operation 144 while the substrate is at a first temperature that is the same temperature as used for operation 142 (from about −270° C. to about 100° C.). In this example, after a first portion of the tunnel barrier layer 118 is deposited, the substrate temperature is raised to a second temperature to be from about 300° C. to about 600° C., or from about 450° C. to about 500° C., and the second portion of the tunnel barrier layer 118 is deposited at the second temperature. The total thickness of the tunnel barrier layer 118 is from about 1 Å to about 15 Å. The first portion of the tunnel barrier layer 118 can be from about 10% to about 90% of a total thickness of the tunnel barrier layer 118, or from 40% to 60% of the total thickness. In one example of operation 144, the tunnel barrier layer 118 is formed in a PVD chamber using a metal-oxide target such as MgO and Ar gas based plasma. In an alternate embodiment, the tunnel barrier layer 118 is formed in the PVD chamber at operation 144 using a metal target such as Mg, Ti, Hf, Ta, or Al and Ar gas based plasma while $O_2$ is present in the PVD chamber to form the metal-oxide.

At operation 144A, subsequent to forming the tunnel barrier layer 118 at operation 144, the temperature of the substrate 102 is modified to promote the bcc lattice structure of the tunnel barrier layer 118. During operation 144A, the substrate temperature is lowered from the second temperature used for deposition of the second portion of the tunnel barrier layer 118 (300° C. to 600° C.) at operation 144 to a temperature from −270° C. to about 100° C., or from about −200° C. to about 25° C. By heating in between the depositions of the first and second portions of the tunnel barrier layer 118 at operation 144, the formation of a bcc lattice structure throughout the tunnel barrier layer 118 is promoted. The subsequent cooling at operation 144A helps block the formation of an undesired lattice structure in the tunnel barrier layer.

At operation 146, the magnetic storage layer 120 is formed in a PVD chamber. The temperature of the substrate during operation 146 can be from −270° C. to about 100° C. The magnetic storage layer 120 has a bcc lattice structure as-formed. The formation of the magnetic storage layer 120 can occur in various ways depending upon the intended composition. The magnetic storage layer 120 can comprise one or more layers of $Co_xFe_yB_z$, and, in some examples, one or more layers of Ta, Mo, W, or Hf. As such, the deposition of the magnetic storage layer 120 in the PVD chamber can include Ar plasma and a $Co_xFe_yB_z$ alloy target, or individual targets of Co, Fe, and B, or a combination of an alloy target and an element target such as a CoFe target and a B target. In examples where the magnetic storage layer 120 comprises Ta, Mo, W, or Hf, a sputtering target of Ta, Mo, W, or Hf is sputtered in the chamber using plasma formed from Ar.

In one example, the magnetic storage layer 120 can be formed in a single PVD chamber using a plasma formed using Ar by adjusting a shield to expose or protect one or more targets such as those discussed above that are used to form $Co_xFe_yB_z$ and layers of Ta, Mo, W, or Hf. In another example, a $Co_xFe_yB_z$ layer of the magnetic storage layer 120 is sputtered in a PVD chamber using a $Co_xFe_yB_z$ alloy target using Ar plasma. In another example, the $Co_xFe_yB_z$ layer is formed in the PVD chamber by using individual Co, Fe, and B, targets and Ar gas based plasma. In still another example, the $Co_xFe_yB_z$ layer is formed in the PVD chamber using an Ar gas based plasma and an alloy target and a compound element target, for example, a CoFe target and a B target. The Ta, Mo, W, or Hf layer of the magnetic storage layer 120 can be sputtered in the PVD chamber using a Ta target, a Mo target, a W target, or a Hf target. At operation 148, the first capping interlayer 122A of the capping layer 122 is deposited on the magnetic storage layer 120.

In an embodiment, at operation 146A subsequent to deposition of the magnetic storage layer 120, the temperature of the substrate 102 can be further modified. In one example of substrate temperature modification at operation 146A, the substrate temperature is first raised to a temperature from about 300° C. to about 600° C., or from about 350° C. to about 450° C. By heating the substrate subsequent depositing the magnetic storage layer 120 at operation 146, the lattice structure of the magnetic storage layer 120 is more readily formed as a bcc lattice structure. Further at operation 146B, the substrate 102 is optionally cooled after heating at operation 146A to a temperature from −270° C. to about 100° C., or from about −200° C. to about 25° C. Operation 146B is optional in this example because the magnetic storage layer 120 is formed to have a bcc lattice structure, so whether or not operation 146B is executed depends on an intended lattice structure of the first capping interlayer 122A. If the first capping interlayer 122A discussed below is to have a lattice structure other than a bcc lattice structure, such as an fcc lattice structure, operation 146B can be executed prior to formation of the first capping interlayer at operation 148. In another example, if the first capping interlayer 122A is to be formed with a bcc lattice structure, e.g., the same lattice structure as the underlying magnetic storage layer 120, operation 146B may not be executed prior to operation 148.

In an embodiment, the first capping interlayer 122A of the capping layer 122 is formed in a PVD chamber at operation 148 that may be different than the PVD chamber where non-oxide layers are formed, as both Ar plasma and $O_2$ are present in the PVD chamber during operation 148 when oxide layers are formed. The first capping interlayer 122A is deposited in the PVD chamber at operation 148 by sputtering a Mg target using an Ar plasma, $O_2$ is also present in the PVD chamber. In another example at operation 148, the first capping interlayer 122A is formed in the PVD chamber using an MgO sputtering target and Ar plasma. In this example where MgO or an iron-containing oxide is used to form the first capping interlayer 122A, it can have a bcc lattice structure as-formed. In this example, since that is the same lattice structure as the underlying magnetic storage layer 120, the optional cooling at operation 146A may not be used. In an example where the first capping interlayer 122A is to be formed of the same material (e.g., Mg) as the tunnel barrier layer 118, the PVD chamber used for operation 144 can be the same PVD chamber that is used for operation 148 to form the first capping interlayer 122A. In another example of the first capping interlayer 122A, it is formed of Ru and/or Ir, and has an fcc lattice structure, which is different than the underlying magnetic storage layer 120 that has a bcc lattice structure. In this example, prior to formation of the first capping interlayer 122A at operation 148, the substrate temperature is lowered using operation 146A. The second capping interlayer 122B is deposited on the first capping interlayer 122A at operation 150. Operation 150 can occur in a separate, different, PVD chamber than that used to sputter the first capping interlayer 122A if $O_2$ is used in operation 148, since there is no $O_2$ used in the PVD chamber to form the first capping interlayer 122A. The second capping interlayer 122B is formed in a PVD chamber using Ar plasma and one or more sputtering targets composed of Ru, Ir, and/or Ta. Depending upon the composition of the second capping interlayer 122B, operation 150 may occur in a PVD chamber that is also used to form, for example, the SyF coupling layer 110 at operation 136. The second capping layer comprises Ta and/or Ru and/or Ir, and can have an fcc lattice structure.

Further in the method 100B, at operation 152, a hardmask layer 124 is deposited over the second capping interlayer 122B in a PVD chamber. Depending upon the type of hardmask layer 124 used in the MTJ stack 100A, operation 152 may or may not occur in the presence of $O_2$. For example, if the hardmask layer 124 is a metal-oxide hardmask, an $O_2$ and Ar based plasma can be used during operation 152 along with a metallic sputtering target or targets to form the metal-oxide layer, or a metal-oxide sputtering target can be used to deposit the hardmask layer 124, in which case $O_2$ is not used in hardmask layer 124 formation at operation 150. In some embodiments, when the hardmask layer 124 is amorphous carbon or spin-on carbon, operation 152 occurs in a CVD or spin-on deposition chamber. The substrate temperature at operation 152 varies depending upon the type of hardmask formed. The MTJ stack 100A formed at operations 126-152 can be subjected to one or more processes that are collectively indicated by operation 154 in the method 100B. These operations can include high-temperature (on the order of 400° C.) operations. In one example, the processes at operation 154 may include a pre-patterning anneal operation, which is followed by an MTJ patterning operation. In an alternate embodiment, the MTJ patterning at operation 154 can include a plurality of processes such as patterning the hardmask layer 124 and can further include an operation to etch the MTJ stack 100A after the hardmask layer 124 is patterned to form a plurality of individual pillars from the MTJ stack 100A using the patterned hardmask layer as an etch mask.

In an alternate embodiment at operation 154, a thermal annealing operation is executed to repair, crystallize, and enhance lattice structures of the film stack, including the magnetic storage layer(s) and the magnetic reference layer(s) in the MTJ stack 100A. The thermal annealing performed at operation 154 can act to further crystallize at least the material of the magnetic reference layer(s) 116 and magnetic storage layer(s) 120. The crystallization of the magnetic reference layer(s) and magnetic storage layer(s) upon deposition of those layers establishes the perpendicular anisotropy of the MTJ stack 100A, while maintaining its desired electrical and mechanical properties. Embodiments of MTJ stacks fabricated following the operations of method 100B are shown and discussed below, and the embodiments are configured to maintain the as-deposited face-centered cubic (fcc) <111> crystalline structure of the first and second pinning layers after the thermal annealing operation executed at operation 154, and/or during additional or alternate back end processing operations that occur at high temperatures on the order of 400° C.

Figure 2A:
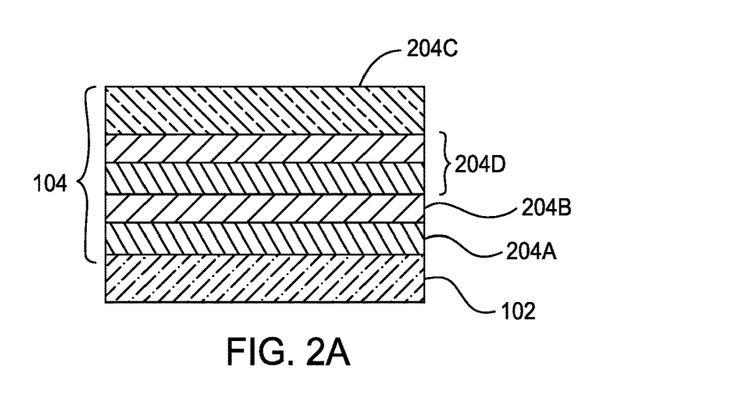
FIG. 2A is a magnified view of the buffer layer of an MTJ stack according to embodiments of the present disclosure.
Figure 2B:
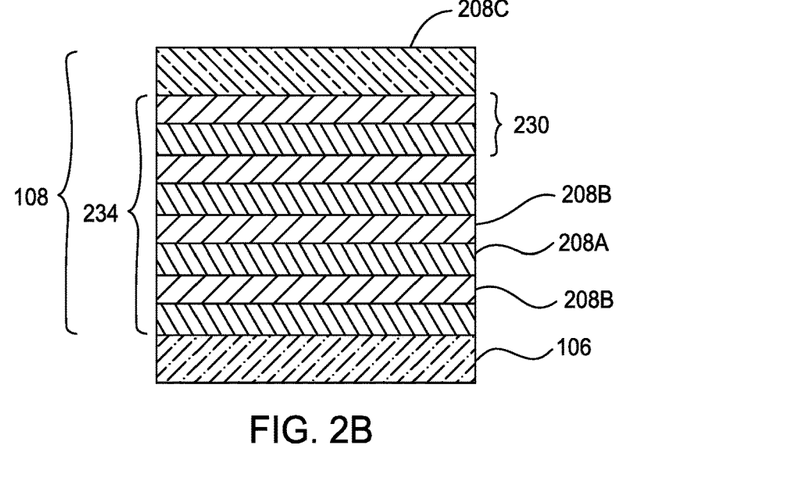
FIG. 2B is a magnified view of the first pinning layer of an MTJ stack according to embodiments of the present disclosure.

FIGS. 2A-2F are schematic illustrations of layers of an MTJ stack fabricated according to embodiments of the present disclosure. FIG. 2A is a magnified view of the buffer layer 104 according to embodiments of the present disclosure. The buffer layer 104 comprises tantalum (Ta) or TaN, or a layered stack of Ta and TaN, and, in some examples, comprises $Co_xFe_yB_z$, alone or in combination with Ta, TaN, or a Ta/TaN layered stack. In an example of the buffer layer 104, the buffer layer 104 comprises at least one bilayer 204D. The at least one bilayer 204D comprises a first buffer interlayer 204A and a second buffer interlayer 204B formed in an alternating fashion on the substrate 102 for at least one iteration of the at least one bilayer 204D. In this example, the first buffer interlayer 204A comprises Ta and the second buffer interlayer 204B comprises TaN, and the first buffer interlayer 204A is in contact with the substrate 102. In another example the first buffer interlayer 204A comprises TaN and the second buffer interlayer 204B comprises Ta, and thus TaN is in direct contact with the substrate 102. In other examples of the buffer layer 104, as shown in FIG. 1A, $Co_xFe_yB_z$ is used alone for the buffer layer 104 and would thus be in direct contact with the substrate 102. In another example, as shown in FIG. 2A, a third buffer layer 204C is formed over the at least one bilayer 204D. In this example, the third buffer layer 204C is fabricated from $Co_xFe_yB_z$ and formed to a thickness of up to 10 Å. Thus, depending upon the configuration of the buffer layer 104, a thickness of the buffer layer 104 ranges from 1 Å thick to 60 Å thick. In an example where the third buffer layer 204C $Co_xFe_yB_z$ is employed, z is from about 10 wt. % to about 40 wt. %, y is from about 20 wt. % to about 60 wt. %, and x is equal to or less than 70 wt. %.

FIG. 2B is a magnified view of the first pinning layer 108 according to an embodiment of the present disclosure. The first pinning layer 108 is fabricated from at least one bilayer 230, and when two or more bilayers 230 are employed, the two or more bilayers 230 can be said to form a bilayer stack 234. Each bilayer 230 is fabricated from a first interlayer 208A and a second interlayer 208B. The bilayers of the first pinning layer 108 are expressed as $(X/Y)_n$, $(208A/208B)_n$, where each bilayer is a combination of a first material X and a second, different, material Y, and where n is a number of bilayers in the first pinning layer 108. In an embodiment, X is Co and Y is one of Pt or Ni. While n=4 in the example in FIG. 2B, in alternate embodiments, n is from 1 to 10. In an embodiment, the at least one bilayer 230 comprises a thickness from about 2 Å to about 16 Å. In one example, the first interlayer 208A comprises Co and is from about 1 Å to about 8 Å thick and the second interlayer 208B comprises Pt or Ni, or combinations or alloys thereof, and is from about 1 Å to about 8 Å thick. Further in another embodiment of the first pinning layer 108, the at least one bilayer 230 is formed directly on and in contact with the seed layer 106, and an overlayer 208C is formed on top of the at least one bilayer 230. The overlayer 208C is in contact with the SyF coupling layer 110. In an embodiment, the overlayer 208C is from 1

Å to 10 Å thick. In this example, the overlayer 208C is Co. Depending upon the embodiment, an overall thickness of the first pinning layer 108 is from 1 nm to about 18 nm. In other examples, one or more transitional layers may be formed between the first pinning layer 108 and the seed layer 106 that do not negatively affect the properties of the MTJ stack.

Figure 2C:
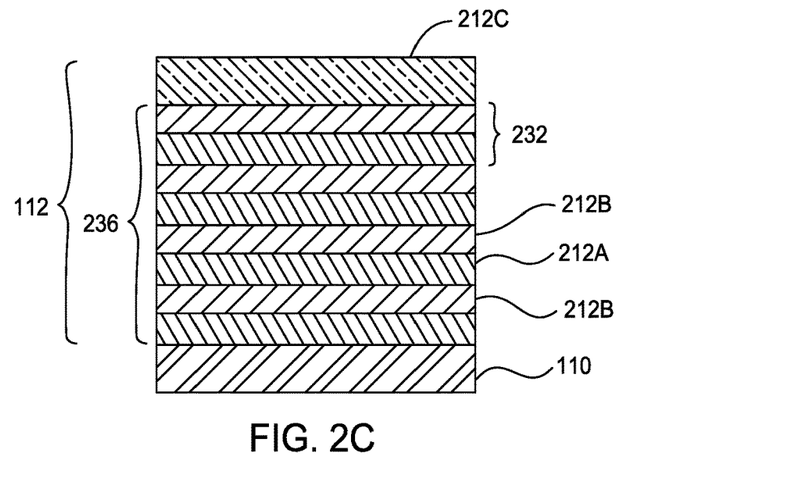
FIG. 2C is a magnified view of the second pinning layer of an MTJ stack according to embodiments of the present disclosure.

FIG. 2C is a magnified view of the second pinning layer 112 according to embodiments of the present disclosure. In an embodiment, the second pinning layer 112 is fabricated at least one bilayer 232. Each bilayer 232 comprises a first interlayer 212A that can be Co and a second interlayer 212B that can be Pt or Ni, or combinations or alloys thereof. When two or more bilayers such as the bilayer 232 are employed in the second pinning layer 112, the two or more bilayers may be referred to as a bilayer stack 236. Thus, at operation 138 in FIG. 1B, when one or more bilayers are deposited, a separate sputtering target may be used to form each of the first interlayer 208A and the second interlayer 208B of the bilayer 232. The at least one bilayer 232 of the second pinning layer 112 is expressed as $(X/Y)_n$, $(212A/212B)_n$, where n is a number of bilayers. While n=4 in the example in FIG. 2C, in alternate embodiments, n is from 1 to 5. In an embodiment, the at least one bilayer 232 comprises a total thickness from about 2 Å to about 16 Å. In one example, the first interlayer 212A is a Co layer from about 1 Å to about 8 Å thick and the second interlayer 212B is from about 1 Å to about 8 Å thick. In various embodiments, the second interlayer 212B comprises Ni or Pt or combinations or alloys thereof.

Further in another embodiment, the second pinning layer 112 comprises an overlayer 212C of Co formed on top of the at least one bilayer 232. In other examples of the second pinning layer 112, no overlayer 212C is present. In an embodiment, the overlayer 212C is from about 1 Å to about 10 Å thick. Depending upon the embodiment, an overall thickness of the second pinning layer 112, which may comprise one or more layers including the at least one bilayer 232 as discussed herein, is from 0.3 nm to 15 nm. In some examples, a transitional layer may be employed between the at least one bilayer 232 and the second pinning layer 112 or between the at least one bilayer 232 and the SyF coupling layer 110, or both, where such transition layer(s) do not affect performance of the MTJ stack.

In an embodiment, the first pinning layer 108 and second pinning layer 112 each comprise the same interlayer composition and/or a differing interlayer thickness. In an alternate embodiment, the first pinning layer 108 and second pinning layer 112 each comprise different compositions and/or thicknesses. In an embodiment, the first pinning layer 108 includes at least one bilayer comprising a first interlayer of Co and a second interlayer of Pt, and further comprises a Co overlayer formed over the at least one bilayer. In this example, the second pinning layer 112 is formed over the SyF coupling layer 110 and includes one or more bilayers. In an embodiment, the one or more bilayers of the second pinning layer 112 include a first interlayer of Co and a second interlayer of Pt. In another embodiment, the first pinning layer 108 includes at least one bilayer comprising a first interlayer of Co and a second interlayer of Ni, and further includes a Co overlayer formed over the at least one bilayer such that Co overlayer is in contact with the SyF coupling layer 110 formed from Ir. In this example, the second pinning layer 112 includes one or more bilayers. In this example, the one or more bilayers of the second pinning layer 112 include a first interlayer of Co and a second interlayer of Pt.

Figure 2D:
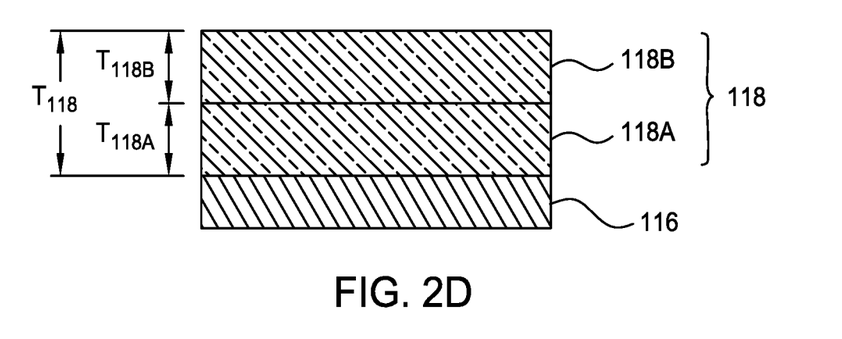
FIG. 2D is a magnified view of an example tunnel barrier layer of an MTJ stack according to embodiments of the present disclosure.

FIG. 2D is a magnified view of an example tunnel barrier layer 118 according to embodiments of the present disclosure. Tunnel barrier layer 118 has an overall thickness $T_{118}$. As discussed above in FIG. 1B at operation 144, a first portion 118A is deposited at a first temperature that can be the same temperature or a substantially similar temperature used for operation 142 (−270° C. to about 100° C.). In this example, after the first portion 118A of the tunnel barrier layer 118 is deposited, the substrate temperature is raised to from about 300° C. to about 600° C. and the second portion 118B of the tunnel barrier layer 118 is formed. The first portion 118A can be formed to a thickness $T_{118A}$ while the substrate 102 is at the first temperature. The thickness $T_{118A}$ is from about 10% to about 90% of a total thickness $T_{118}$ of the tunnel barrier layer 118, or from 40% to 60% of the total thickness. The second portion 118B can be formed to a second thickness $T_{118B}$, the sum of $T_{118B}$ and $T_{118A}$ is the total thickness $T_{118}$ of the tunnel barrier layer 118. The total thickness of the tunnel barrier layer 118 is from about 1 Å to about 15 Å.

Figure 2E:
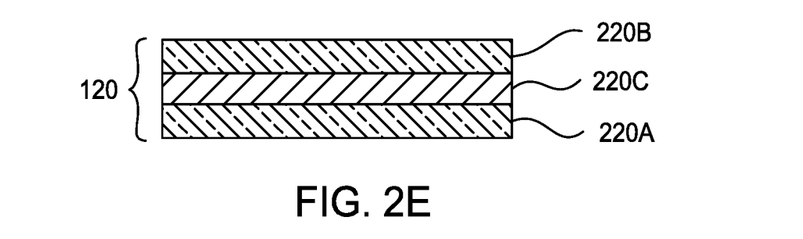
FIG. 2E is a magnified view of an example magnetic storage layer of an MTJ stack according to embodiments of the present disclosure.

FIG. 2E is a magnified view of an example magnetic storage layer 120 according to embodiments of the present disclosure. As shown in FIG. 2E, a first magnetic layer 220A of the magnetic storage layer 120 and a second magnetic layer 220B of the magnetic storage layer 120 are each fabricated from $Co_xFe_yB_z$. A third layer 220C fabricated from Ta, Mo, W, Hf, or combinations thereof is disposed therebetween, and it contains dopants such as boron, oxygen, or other dopants. The magnetic storage layer 120 is thus fabricated from three layers, a first magnetic layer 220A and a second magnetic layer 220B, and a third layer 220C disposed between the first magnetic layer 220A and the second magnetic layer 220B. The third layer 220C strengthens a pinning moment perpendicular to the substrate plane (e.g., a plane perpendicular to the substrate 102), which promotes magnetic anisotropy, a directional dependence of the structure's magnetic properties.

Figure 2F:
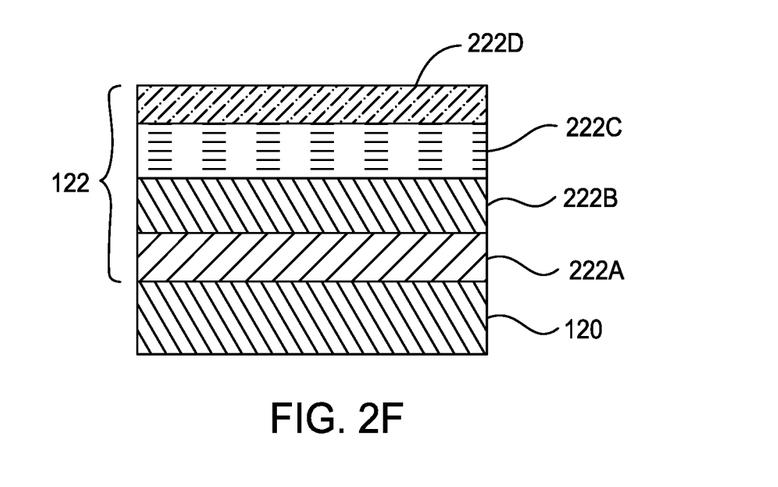
FIG. 2F is a magnified view of an example capping layer 122 according to an embodiment of the present disclosure

FIG. 2F is a magnified view of an example capping layer 122 according to an embodiment of the present disclosure. A total thickness of the capping layer 122 is from 2 Å to 120 Å and in some embodiments a total desired thickness for the capping layer (e.g., including all interlayers as shown in FIG. 2F) is about 60 Å. In an embodiment, the capping layer 122 comprises a plurality of interlayers. A first capping interlayer 222A is fabricated from MgO or another iron-containing oxide formed directly on the magnetic storage layer 120 to a thickness from about 2 Å to about 10 Å. On top of the first capping interlayer 222A, a second capping interlayer 222B of Ru, Ir, or combinations thereof is formed to a thickness from 1 Å to about 30 Å. In an embodiment, a third capping interlayer 222C is optionally formed of Ta on the second capping interlayer 222B to a thickness of 1 Å to about 30 Å. Thus, some embodiments of a capping layer 122 do not contain a third capping interlayer 222C. In an embodiment, a second capping interlayer 222D is optionally formed on the third capping interlayer 222C and is formed of Ru, Ir, or combinations thereof to a thickness of up to 50 Å. In various embodiments, the capping layer 122 comprises only the first capping interlayer 222A, or the first capping interlayer 222A and the second capping interlayer 222B, or the first capping interlayer 222A, the second capping interlayer 222B, and a third capping interlayer 222C, or the first, second, and third capping layers 222A-222C. In some embodiments, transitional layers may be used in between some or all of the first capping interlayer 222A, the second capping interlayer 222B, and the third capping interlayer 222C, or may be between the capping layer 122 and the magnetic storage layer 120, such that the performance of the MTJ stack is not negatively impacted by the transitional layer(s).

Figure 3:
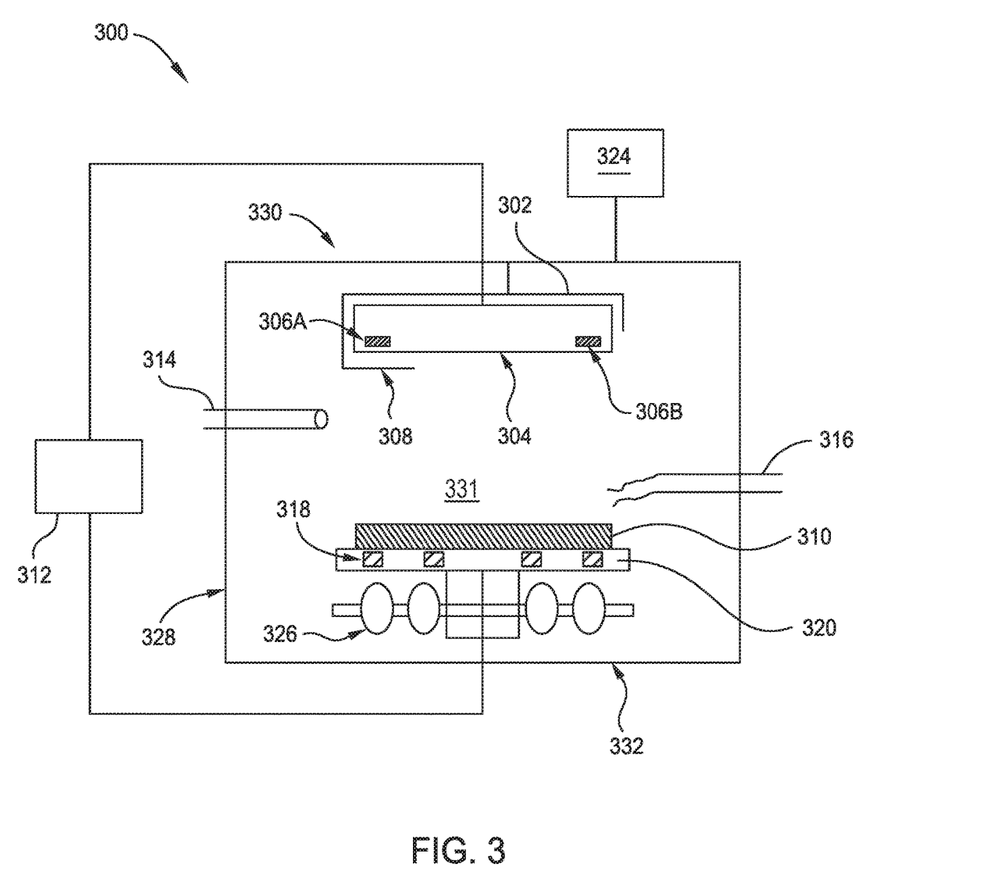
FIG. 3 is a schematic illustration of a physical vapor deposition (PVD) chamber configured to fabricate MTJ stacks according to embodiments of the present disclosure.

FIG. 3 shows a PVD chamber 300 according to embodiments described herein. As discussed above, a plurality of PVD chambers can be employed to form the MTJ stack 100A. The PVD chamber 300 is an example PVD chamber that can be configured to form one or more layers of the MTJ stack 100A. The PVD chamber 300 comprises a chamber top 330, a chamber bottom 332, and a chamber wall 328. A target support 302, which is adapted for receiving a target cartridge 304 comprising at least one sputtering target, is coupled to the chamber top 330. In some embodiments the target support 302 may be adapted for supporting and/or driving a rotatable target such as the shielded target discussed herein. The target cartridge 304 can be fabricated from conductive materials such as copper-based materials, or can be fabricated from the same material as a target coupled to the cartridge such as the target 306A or 306B. In alternate embodiments, the cartridge can be fabricated from a non-conductive material and can comprise conductive elements. While example PVD chamber 300 is shown herein, multiple PVD chambers can be used as discussed above to form the MTJ stack, some PVD chambers can be configured to form oxide layers or nitride layers, and one or more PVD chambers can be configured as shown in FIG. 3 where one or more targets are provided. In one example, the PVD chamber 300 includes the target cartridge 304 which can comprise one or more sputtering targets illustrated as 306A and 306B. The target cartridge 304 is described below in FIG. 4. A shielding mechanism 308 is disposed opposite the target support 302 and selectively shields one or more targets (306A/306B) in the target cartridge 304 from plasma during the MTJ stack formation discussed in the method 100B. The shielding mechanism 308 can be rotated at different operations of the method 100B to expose one or more targets (306A, 306B), in series or simultaneously, to the plasma in the PVD chamber.

Further in the example PVD chamber 300, a substrate support pedestal 320 is positioned opposite the target cartridge 304 towards the chamber bottom 332, and a substrate 310 is disposed on the substrate support pedestal 320 when the pedestal 320 is at a predetermined temperature for deposition as discussed above. The substrate support pedestal 320 can have one or more heating elements 318 coupled to it or disposed therein. The heating elements 318 can be used to raise and/or lower the temperature of the substrate 310 during MTJ stack formation operations such as those discussed above in FIG. 1B. A controller 324 is in communication with the PVD chamber 300 and is configured to execute a plurality of instructions to form the MTJ stack. The controller 324 is configured to execute instructions from a computer-readable medium that are configured to cause a computing system to execute, for example, the method 100B. The instructions executed by the controller 324 can include various aspects of the method 100B, including which one or more targets 306A/306B to be exposed or shielded during a deposition process, a pressure of the PVD chamber, and/or a temperature of the PVD chamber before, during, and after the formation of each layer of the MTJ stack. The instructions can further include if and/or when to transfer the substrate to a different PVD chamber other than the PVD chamber 300. While FIG. 3 shows the substrate support pedestal 320, other configurations can be employed for substrate support. The PVD chamber 300 further includes a power supply 312 for applying a voltage to a cathode (which may for instance be the target cartridge 304 and/or the target(s) 306A/306B) and an anode (which may for instance be the substrate 310). As an example, the targets 306A and 306B are shown as a cathode and the substrate support pedestal 320 is shown as an anode in FIG. 3. In some examples, each target 306A and 306B acts as a separate electrode. The applied voltage creates an electrical field in the processing region 331, which may be used to form plasma to sputter the one or more targets 306A/306B in the target cartridge 304. The PVD chamber 300 according to embodiments described herein may have a gas manifold (not shown) coupled to a first gas inlet 314 and a second gas inlet 316 formed in a chamber wall 328. The gas manifold is configured to supply gases from gas sources (not pictured) including gases such as Ar, Xe, and Kr that can be used to form plasma, as well as He and $H_2$, and/or $O_2$ or $N_2$ if the PVD chamber 300 is configured to form oxide and/or nitride layers or interlayers. In an embodiment, a first gas inlet 314 supplies gas towards the substrate surface to be coated. The first gas inlet 314 may be directed to the substrate receiving portion 308 in order to provide a first gas to the substrate during the deposition process. A second gas inlet 316 may be provided for supplying gas to be turned into plasma within the PVD chamber 300 (for instance a noble gas, such as argon). The locations and positions of the first gas inlet 314 and the second gas inlet 316 can vary depending upon the embodiment. In some examples, more than two gas inlets can be employed in the PVD chamber 300.

During operation of the PVD chamber 300, for example, during the formation of the MTJ stack, the heaters 318 in the substrate are adjusted to bring the substrate 310 to a predetermined temperature. In another example, the PVD chamber 300 comprises a plurality of radiant heat lamps 326 that are used to raise or lower the temperature of the substrate 310. While the plurality of radiant heat lamps 326 are shown in FIG. 3 as being disposed underneath the substrate support pedestal 320, in other examples the plurality of radiant heat lamps 326 can be disposed above the substrate 310 and/or in other positions within the chamber relative to the substrate 310. In still other embodiments, a laser may be used to control the temperature of the substrate 310. The laser can be configured to operate in a laser chamber that is coupled to the PVD chamber 300 or to a transfer chamber that is also coupled to the PVD chamber 300. The adjustment of the temperature of the substrate can be in response to execution of MTJ stack fabrication instructions executed by the controller 324. These instructions can depend upon factors including the materials used to form the layers of the MTJ stack and the intended lattice structure of those layers.

Figure 4:
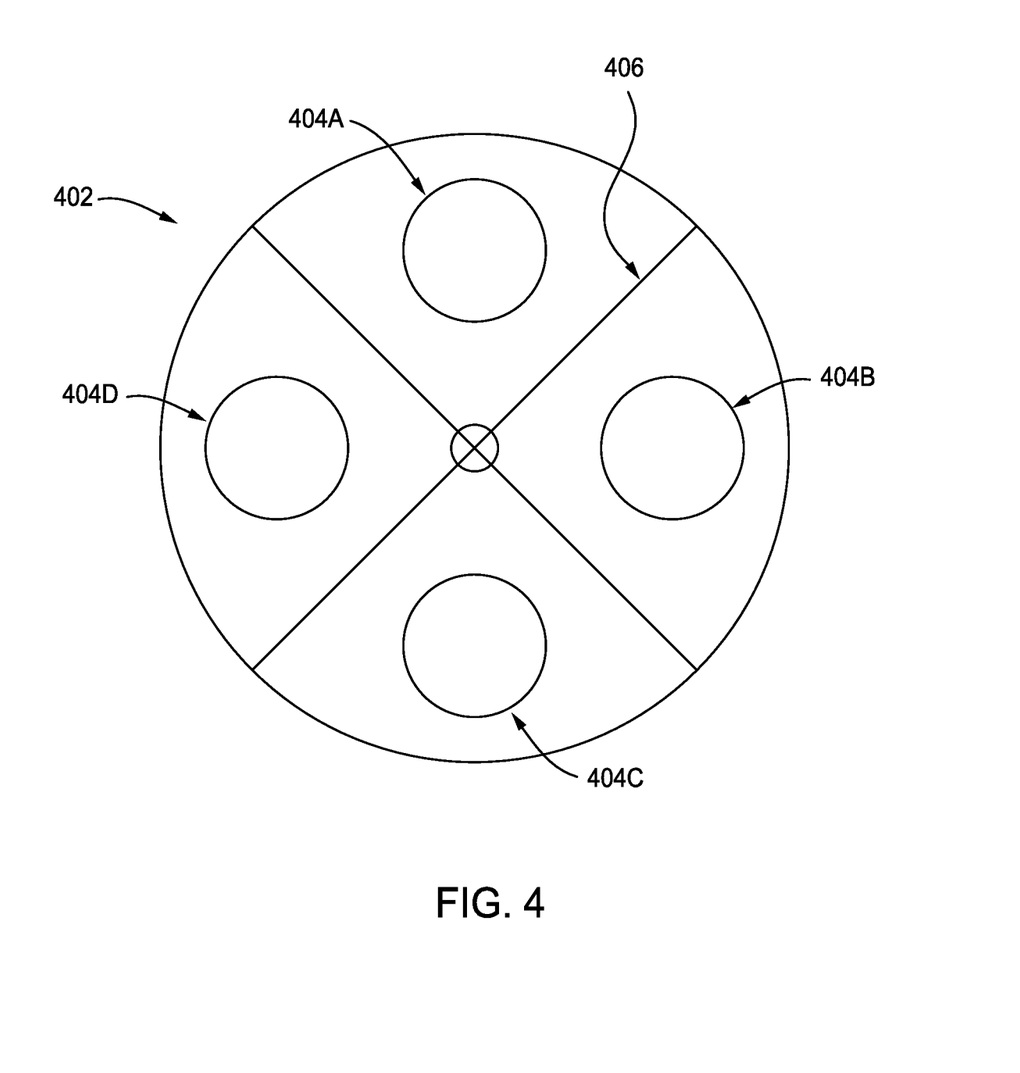
FIG. 4 is an example target cartridge used in a PVD chamber according to embodiments of the present disclosure.

FIG. 4 is an example target cartridge according to embodiments of the present disclosure. FIG. 4 illustrates a target cartridge 402 that may be similar to the target cartridge 304 in FIG. 3. The target cartridge 402 comprises a plurality of sputtering targets 404A, 404B, 404C, and 404D. While four sputtering targets are shown in FIG. 4, in some examples, a single target is used, and, in other examples, 2-10 or more targets can be used. Each target 404A, 404B, 404C, and 404D can comprise an element or an alloy or compound. The shielding mechanism 308 from FIG. 3 can be moved to selectively reveal one or more sputtering targets during deposition of the various layers. A support structure 406 is configured to further separate the sputtering targets 404A, 404B, 404C, and 404D. The support structure 406 acts as a wall in between adjacent targets, to act in concert with the shielding mechanism 308 in FIG. 3 to isolate the one or more targets from the plasma during deposition. While the target cartridge 402 is shown as having a circular shape in FIG. 4, in other embodiments, polygons, ellipses, or other geometries can be used for the target cartridge. Similarly, while the sputtering targets 404A, 404B, 404C, and 404D are shown in FIG. 4 as having a circular shape, and being of a similar shape and size, various geometries including polygons can be employed in alternate embodiments, and the sputtering targets can vary in both shape and size.

Using the systems and methods discussed herein, an improved MTJ stack is fabricated by varying the substrate temperature during, before, and/or after layer deposition of the various layers of the MTJ stack. The substrate temperature during the deposition of various layers can be tuned to either promote formation of a lattice structure of a layer that is the same as the lattice structure of the underlying layer, or to block the texture of the underlying layer so that the layer deposited on top of the underlying layer forms a different lattice structure than that of the underlying layer. The resultant MTJ stacks are therefore fabricated to have improved lattice matching and to maintain a plurality of magnetic and electrical properties subsequent to processing at temperatures on the order of 400° C.

While the foregoing is directed to embodiments of the present disclosure, other and further embodiments of the disclosure may be devised without departing from the basic scope thereof, and the scope thereof is determined by the claims that follow.

What is claimed:

1. A method of fabricating a device comprising:
   forming a magnetic tunnel junction stack, wherein forming the magnetic tunnel junction stack comprises:
      depositing, via physical vapor deposition (PVD), a buffer layer on a substrate, wherein the substrate is at a buffer deposition temperature;
      depositing, via PVD, a seed layer on the buffer layer, the substrate being at a seed layer deposition temperature from 200° C. to 600° C. during deposition of the seed layer;
      depositing, via PVD, a first pinning layer on the buffer layer, the substrate being at a first pinning layer deposition temperature during deposition of the first pinning layer;
      depositing, via PVD, a synthetic anti-ferrimagnetic (SyF) coupling layer on the first pinning layer, wherein the substrate is at a SyF coupling layer deposition temperature during deposition of the SyF coupling layer;
      depositing, via PVD, a second pinning layer on the SyF coupling layer, while the substrate is at a second pinning layer deposition temperature;
      depositing, via PVD, a structure blocking layer on the second pinning layer while the substrate is at the structure blocking layer deposition temperature;
      depositing, via PVD, a magnetic reference layer in contact with the structure blocking layer;
      depositing, via PVD, a tunnel barrier layer in contact with the magnetic reference layer; and
      depositing, via PVD, a magnetic storage layer in contact with the tunnel barrier layer.

2. The method of claim 1, wherein the buffer deposition temperature is about room temperature, the first pinning layer deposition temperature is equal to or less than the seed layer deposition temperature, the SyF coupling layer deposition temperature is equal to or less than the first pinning layer deposition temperature, and the second pinning layer deposition temperature is equal to or less than the first pinning layer deposition temperature.

3. The method of claim 1, further comprising: lowering the substrate temperature from the second pinning layer deposition temperature to a structure blocking layer deposition temperature from about −270° C. to about 100° C.

4. The method of claim 1,
   wherein the first pinning layer comprises at least one bilayer and an overlayer, wherein the at least one bilayer of the first pinning layer comprises an interlayer of cobalt (Co) from 1 Å to 8 Å thick and an interlayer of platinum (Pt) or nickel (Ni) from 1 Å to 8 Å thick;
   wherein the second pinning layer comprises at least one of a bilayer or an overlayer, wherein the at least one bilayer of the second pinning layer comprises an interlayer of cobalt (Co) from 1 Å to 8 Å thick and an interlayer of platinum (Pt) or nickel (Ni) from 1 Å to 8 Å thick; and
   wherein the structure blocking layer comprises tantalum (Ta), molybdenum (Mo), tungsten (W), or combinations thereof and is from 1 Å to 8 Å thick.

5. The method of claim 1, wherein depositing the tunnel barrier layer comprises:
   depositing a first portion of the tunnel barrier layer while the substrate is at a first tunnel barrier layer deposition temperature;
   raising the substrate temperature to a second tunnel barrier layer deposition temperature from about 300° C. to about 600° C.; and
   depositing a second portion of the tunnel barrier layer, wherein the first portion is from 10% to 90% of a total thickness of the tunnel barrier layer.

6. The method of claim 5, further comprising, subsequent to depositing the second portion of the tunnel barrier layer, lowering the substrate temperature to a post-deposition temperature from about −270° C. to about 100° C.

7. The method of claim 6, further comprising:
   subsequent to forming the magnetic storage layer, raising the substrate temperature from about 300° C. to about 600° C.;
   lower the substrate temperature to a capping layer deposition temperature from about −270° C. to about 100° C.;
   depositing a first interlayer of a capping layer on the magnetic storage layer;
   depositing a second interlayer of the capping layer on the first interlayer; and
   depositing a hardmask layer on the second interlayer.

8. A computer-readable medium including instructions that are configured to cause a computing system to:
   deposit a seed layer on a buffer layer, the buffer layer disposed on a substrate;
   deposit a first pinning layer on the buffer layer;
   deposit a synthetic anti-ferrimagnetic (SyF) coupling layer on the first pinning layer;
   deposit a second pinning layer on the SyF coupling layer;
   deposit a structure blocking layer on the second pinning layer;
   deposit a magnetic reference layer on the structure blocking layer;
   deposit a first portion of a tunnel barrier layer on the magnetic reference layer while the substrate is at a first tunnel barrier layer deposition temperature;
   raise the substrate temperature to a second tunnel barrier layer deposition temperature from about 300° C. to about 600° C.;
   deposit a second portion of the tunnel barrier layer on the first portion, wherein the first portion is from 10% to 90% of a total thickness of the tunnel barrier layer;

lower the substrate temperature to a magnetic storage layer deposition temperature from about −270° C. to about 100° C.; and
deposit a magnetic storage layer on the tunnel barrier layer while the substrate is at the magnetic storage layer deposition temperature.

9. The computer-readable medium of claim 8, wherein the instructions are further configured to cool the substrate to a magnetic reference layer deposition temperature from about −270° C. to about 100° C. prior to the deposition of the magnetic reference layer.

10. The computer-readable medium of claim 8, wherein the instructions are further configured to:
subsequent to deposition of the magnetic storage layer, raise the substrate temperature from about 300° C. to about 600° C.;
subsequently lower the substrate temperature to a capping layer deposition temperature from about −270° C. to about 100° C.;
deposit a first interlayer of a capping layer on the magnetic storage layer while the substrate is at the capping layer deposition temperature, wherein the magnetic storage layer comprises a first crystalline structure and the first interlayer comprises a second crystalline structure, wherein the first crystalline structure and the second crystalline structure are different;
deposit a second interlayer of the capping layer on the first interlayer while the substrate is at the capping layer deposition temperature; and
deposit a hardmask layer on the second interlayer of the capping layer.

11. The computer-readable medium of claim 8, wherein the instructions are further configured to:
deposit a first interlayer of a capping layer on the magnetic storage layer while the substrate is at a capping layer deposition temperature from about 300° C. to about 600° C., the magnetic storage layer comprising a first crystalline structure and the first interlayer comprising the same crystalline structure; and
deposit a second interlayer of the capping layer on the first interlayer while the substrate is at the capping layer deposition temperature.

12. The computer-readable medium of claim 8, wherein the instructions are further configured to:
establish a substrate temperature from about 300° C. to about 600° C. prior to deposition of the seed layer or subsequent to deposition of the seed layer.

13. A method of fabricating a magnetic tunnel junction, comprising:
depositing, via physical vapor deposition (PVD), a buffer layer on a substrate;
depositing, via PVD, a seed layer on the buffer layer;
depositing, via PVD, a first pinning layer on the buffer layer;
depositing, via PVD, a synthetic anti-ferrimagnetic (SyF) coupling layer on the first pinning layer;
depositing, via PVD, a second pinning layer on the SyF coupling layer;
depositing, via PVD, a structure blocking layer on the second pinning layer;
depositing, via PVD, a magnetic reference layer in contact with the structure blocking layer;
depositing, via PVD, a tunnel barrier layer in contact with the magnetic reference layer;
depositing, via PVD, a magnetic storage layer in contact with the tunnel barrier layer;

subsequent to depositing the magnetic storage layer, establishing a substrate temperature from about 300° C. to about 600° C.;
subsequently, lowering the substrate temperature to from about −270° C. to about 100° C.;
depositing, via PVD, a capping layer in contact with the magnetic storage layer by depositing a first interlayer of the capping layer on the magnetic storage layer and a second interlayer of the capping layer on the first interlayer; and
depositing a hardmask on the second interlayer of the capping layer.

14. The method of claim 13, further comprising: establishing a substrate temperature from about 300° C. to about 600° C. prior to deposition of the seed layer or subsequent to deposition of the seed layer.

15. The method of claim 13, wherein depositing the tunnel barrier layer comprises:
depositing a first portion of the tunnel barrier layer while the substrate is at a first tunnel barrier deposition temperature;
raising the substrate temperature to a second tunnel barrier layer deposition temperature from about 300° C. to about 600° C.; and
depositing a second portion of the tunnel barrier layer, wherein the first portion is from 10% to 90% of a total thickness of the tunnel barrier layer.

16. The method of claim 13, further comprising:
subsequent to depositing the second portion of the tunnel barrier layer, lowering the substrate the substrate temperature to a magnetic storage layer deposition temperature from about −270° C. to about 100° C.; and
subsequent to depositing the magnetic storage layer, raisin the substrate temperature to a magnetic storage layer deposition temperature from about 300° C. to about 600° C.

17. The method of claim 13,
wherein the depositing, via PVD, the first interlayer on the magnetic storage layer is performed while the substrate is at a capping layer deposition temperature from about −270° C. to about 100° C., wherein the magnetic storage layer comprises a first crystalline structure and the first interlayer comprises a second crystalline structure, wherein the first crystalline structure and the second crystalline structure are different; and
wherein the depositing, via PVD, the second interlayer on the first interlayer is performed while the substrate is at the capping layer deposition temperature.

18. The method of claim 17, wherein the first interlayer of the capping layer comprises a face-centered-cubic (fcc) crystalline structure.

19. The method of claim 13, wherein the structure blocking layer, the magnetic reference layer, the tunnel barrier layer, and the magnetic storage layer each have a body-centered-cubic (bcc) crystalline structure.

20. The method of claim 13, wherein the second pinning layer and the SyF coupling layer each have a face-centered-cubic (fcc) crystalline structure.

21. A method of fabricating a magnetic tunnel junction stack, comprising:
depositing a magnetic reference layer on a structure blocking layer, wherein the structure blocking layer is formed over a substrate;
depositing a tunnel barrier layer on the magnetic reference layer;

subsequent to depositing the tunnel barrier layer, establishing a substrate temperature to be from about −270° C. to about 20° C.; and depositing a magnetic storage layer on the tunnel barrier layer.

22. The method of claim 21, further comprising:

prior to depositing the magnetic reference layer, depositing a buffer layer on the substrate;

depositing a seed layer on the buffer layer, wherein the substrate temperature is from about 300° C. to about 600° C. at least one of prior to depositing the seed layer or subsequent to depositing the seed layer;

depositing a first pinning layer on the seed layer;

depositing a SyF coupling layer on the first pinning layer;

depositing a second pinning layer on the SyF coupling layer; and depositing the structure blocking layer on the on the second pinning layer.

23. The method of claim 21, wherein depositing the tunnel barrier layer comprises:

depositing a first portion of the tunnel barrier layer while the substrate is at a first tunnel barrier layer deposition temperature;

raising the substrate temperature to a second tunnel barrier layer deposition temperature from about 300° C. to about 600° C.; and depositing a second portion of the tunnel barrier layer, wherein the first portion is from 10% to 90% of a total thickness of the tunnel barrier layer.

24. The method of claim 21, further comprising:

subsequent to depositing the magnetic storage layer, establishing the substrate temperature to be from about 300° C. to about 600° C.;

subsequently, lowering the substrate temperature to from about −270° C. to about 100° C.;

depositing a first interlayer of a capping layer on the magnetic storage layer;

depositing a second interlayer of the capping layer on the first interlayer; and depositing a hardmask layer on the second interlayer of the capping layer.

* * * * *